United States Patent [19]

Bradford et al.

[11] Patent Number: 4,980,605
[45] Date of Patent: Dec. 25, 1990

[54] OSCILLOSCOPE TRIGGERING CONTROL CIRCUIT

[75] Inventors: Jeffrey O. Bradford, Portland; Patrick A. Smith, Beaverton, both of Oreg.

[73] Assignee: Tektronix, Inc., Beaverton, Oreg.

[21] Appl. No.: 6,531

[22] Filed: Jan. 23, 1987

[51] Int. Cl.$^5$ ............................................. G01R 13/28
[52] U.S. Cl. ........................................ 315/1; 315/392
[58] Field of Search ............... 315/393, 379, 380, 392, 315/1; 307/228, 590, 592, 606; 324/121 R

[56] References Cited

U.S. PATENT DOCUMENTS 4,109,182  8/1978  Dalton .................................. 315/392
4,121,164  10/1978  Feucht ................................ 307/228

Primary Examiner—Eugene R. LaRoche
Attorney, Agent, or Firm—John P. Dellett; George T. Noe; Peter J. Meza

[57] ABSTRACT

A triggering control circuit varies a holdoff period for one sweep cycle whereby to lock triggering to a different, selected event viewable on an oscilloscope.

3 Claims, 3 Drawing Sheets

OSCILLOSCOPE TRIGGERING CONTROL CIRCUIT

BACKGROUND OF THE INVENTION

The present invention relates to an oscilloscope triggering control circuit and particularly to such a circuit wherein triggering is selectable among a number of triggering events.

In a device such as a oscilloscope, a display sweep is initiated by a trigger signal presented to a sweep generator. Following the display sweep, a recovery period, known as the holdoff period, is required to allow time for the electron beam to return to the left side of the display screen, i.e., to retrace, and to allow time for the sweep generator to stabilize and prepare for the next display sweep.

The trigger signal is generated using an input signal from a predetermined source, and is usually derived from the signal to be displayed by the oscilloscope. The trigger signal comprises a stream of potential trigger points, each a possible candidate for initiating a trigger.

The holdoff on many oscilloscopes has the effect of selecting or locking the specific event displayed from a repetitive input signal. Thus, since the sweep cannot be triggered by a triggering event until the conclusion of the holdoff period, the holdoff period determines the next effective triggering event. When sweep holdoff is utilized in this manner to determine the particular portion of a repetitive signal for viewing, selection of the desired triggering event is frequently obtained by painstaking readjustment of the trigger level control or similar control until the event of interest just happens to trigger the oscilloscope. Once the event of interest is displayed, the oscilloscope will remain locked in correct repetitive operation.

SUMMARY OF THE INVENTION

In accordance with the present invention in a particular embodiment thereof, a holdoff circuit means includes an operator adjustable counter-timer presettable to provide a proper holdoff period in keeping with the frequency of the input signal to be displayed. During each cycle of operation starting with the sweep time, the counter-timer counts down a given holdoff period which in any case must be at least equal to the minimum sweep holdoff required for proper oscilloscope operation. Then for one cycle of circuit operation, e.g., for one sweep period, the count operation of the counter-timer is altered so as to count for a larger or smaller period whereby the holdoff permits the next or previous triggering event to control the triggered sweep of the oscilloscope. After one cycle, the counter-timer reverts to its initial timing cycle and the oscilloscope remains locked onto the desired event.

It is accordingly an object of the present invention to provide an improved triggering circuit for oscilloscopes by means of which a particular portion of an input waveform is more easily selected for viewing.

It is another object of the invention to provide an improved triggering circuit for oscilloscopes wherein the triggering event for sweep control is readily selected.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a block diagram of an overall oscilloscope circuit according to the present invention, FIG. 2 is a block diagram of a programmable counter-timer portion of the FIG. 1 circuit, and FIG. 3 is a waveform chart illustrating operation of the circuitry of FIGS. 1 and 2.

DETAILED DESCRIPTION

Figure 1:
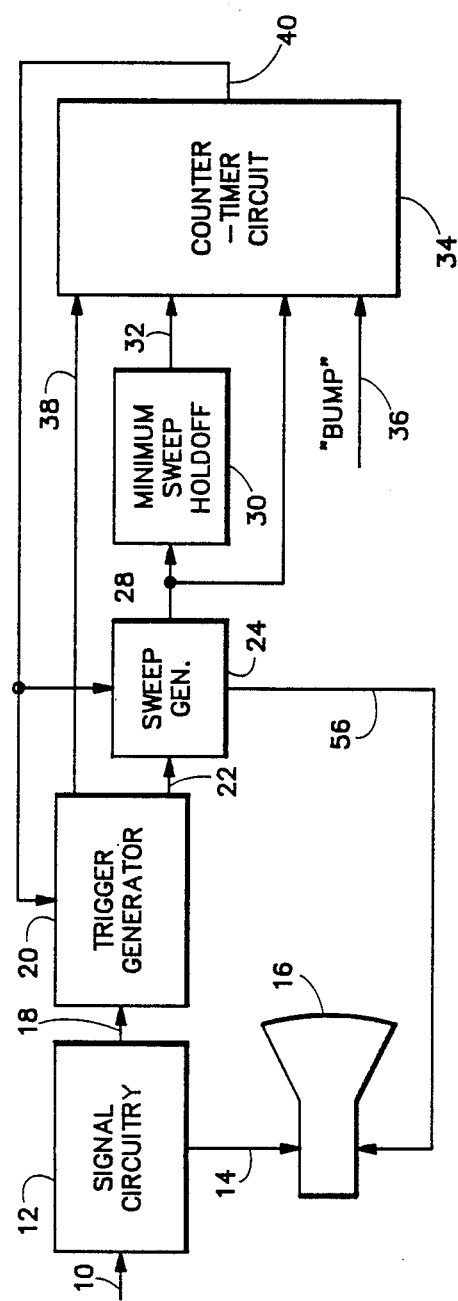

Referring to the drawings and particularly to the oscilloscope circuit of FIG. 1, an input signal received on lead 10 is applied to conventional signal amplifying circuitry 12 adapted to provide an output 14 for controlling the vertical signal input coupled to cathode ray tube or other signal display device 16. Trigger generator 20, receiving trigger pickoff 18, includes conventional trigger detection and conditioning means and is suitably responsive to operator controls (not shown) for generally selecting the level and slope of the input signal utilized in triggering or synchronizing the oscilloscope. Trigger generator 20 generates a main trigger gate 22 adapted for starting sweep generator 24. Sweep generator 24 produces the horizontal sweep signal coupled to cathode ray tube 16, and also supplies a rectangular pulse output 28 to minimum sweep holdoff circuit 30. Circuit 30 suitably comprises the conventional type of sweep holdoff circuit and, upon termination of the sweep, generates an output of sufficient duration for inhibiting retriggering of the oscilloscope until a predetermined sweep holdoff period has concluded. This sweep holdoff period is sufficient in length to enable electron beam retrace and recovery of sweep generator 24.

In the conventional circuit, the output 32 of holdoff circuit 30 would be applied directly to trigger generator 20 and sweep generator 24 in order to inhibit retriggering of the sweep for such predetermined holdoff period. In accordance with the present invention a counter-timer circuit 34 is further included which receives the minimum sweep holdoff signal 32 as well as main sweep gate output 28 from sweep gate generator 24, and an operator controlled, "bump" command input signal 36. Furthermore, the counter-timer circuit 34 receives, as a counting input, the output 38 from trigger generator 20, such output corresponding to each trigger event in time. Suitably, output 38 (which is not held off by circuit 34) is digital in form.

The counter-timer circuit 34 is operable, during its selected mode, to function as the principal holdoff means of the oscilloscope. In accordance with the frequency of the input signal, as hereinafter more fully described, the operator determines a number or count which must be reached after the start of each oscilloscope sweep before holdoff is concluded. In addition, circuit 30 determines the minimum holdoff; the count selected for circuit 34, for proper operation, cannot be less than the minimum which would allow proper oscilloscope operation. In a typical embodiment, the counter-timer 34 counts down to a terminal count, beginning at the time of the start of the main sweep gate signal 28, and when the terminal count is reached, a negative-going, end-of-holdoff signal is provided on lead 40.

However, the oscilloscope may be effectively locked onto the wrong triggering event such that the operator is unable to view the portion of interest in the input signal. In such case, the counting period of circuit 34 is altered or changed for one sweep period whereby the triggering of the oscilloscope can then take place in response to the previous or next triggering event. In order to maintain the synchronized relationship between the oscilloscope sweep and selected trigger, the counter-timer resumes the original operator-selected count after one sweep cycle.

Figure 2:
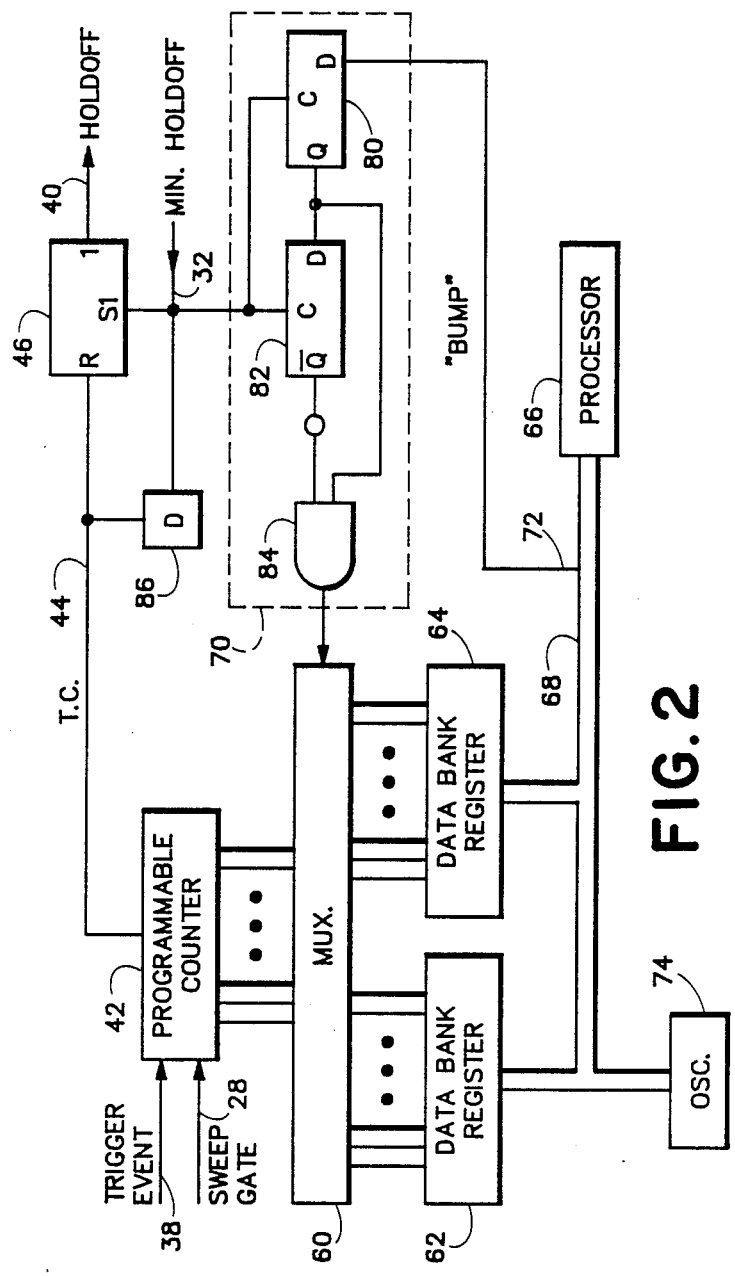

One circuit embodiment for counter-timer 34 is more fully illustrated in block diagram form in FIG. 2. The counter-timer circuit includes a programmable counter 42 which is adapted to count down from a programmed number to a terminal count. When the counter 42 reaches the terminal count, an output pulse is produced on lead 44. Counter 42 counts triggering events supplied in timed pulse form on lead 38, beginning with the main sweep gate signal on lead 28.

Output 44 of counter 42, indicating terminal count, is provided to flip-flop 46 in conjunction with the minimum sweep holdoff signal 32 from the minimum sweep holdoff circuit 30 of FIG. 1. If either the holdoff on lead 32 is active, or if the programmable counter 42 has not reached its terminal count as indicated by a positive-going pulse on lead 44, the output of flip-flop 46 continues to produce a holdoff or sweep inhibiting level on lead 40. Holdoff 32 provides an overriding set input to circuit 46, while TC output 44 provides a reset input. Thus, minimum holdoff cannot be shortened by the TC signal.

Figure 3:
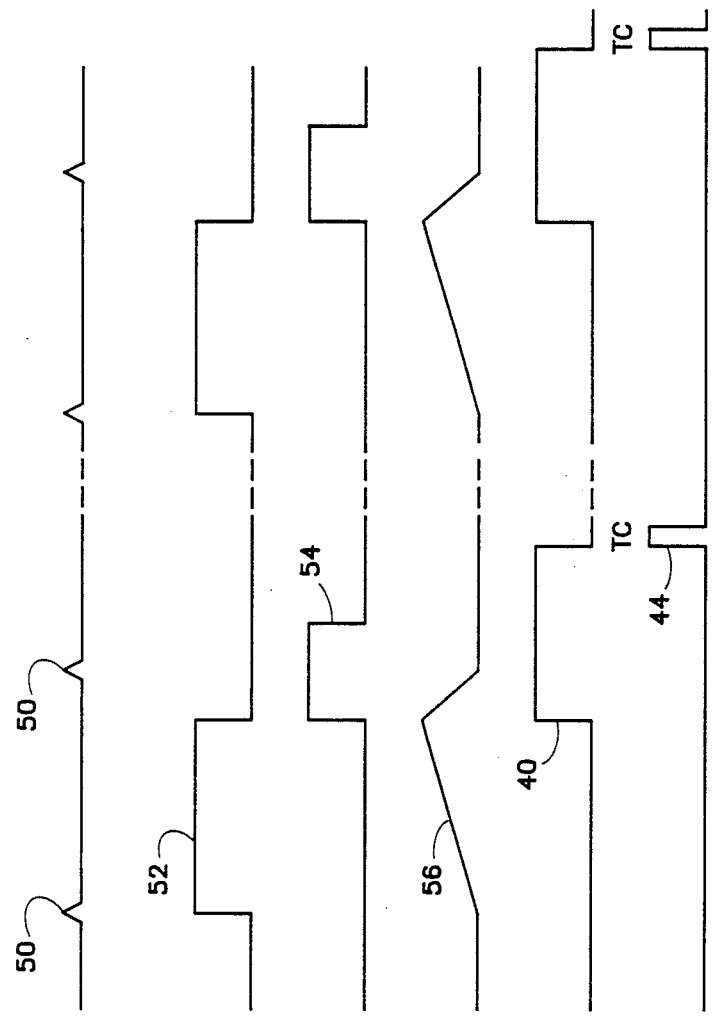

Referring to the simplified waveform chart of FIG. 3, it will be seen that trigger points 50 corresponding to triggering events may be capable of producing a sweep gate 52 so long as holdoff signal 54 is not present, and sweep signal 56 is generated in response to the sweep gate. Holdoff signal 54 is assumed to be the output produced by minimum sweep holdoff circuit 30 in FIG. 1.

At the beginning of each sweep gate, the programmable counter 42 in FIG. 2 counts down, and the holdoff signal 40 is provided in FIG. 2 which stays asserted after minimum holdoff 32 is unasserted. When the counter 42 reaches its terminal count, as indicated by the letters TC in FIG. 3, holdoff 40 is unasserted and then triggering by another event is possible. It will be appreciated that in the actual operation of an oscilloscope, a number of triggering events may occur for each sweep.

Returning to FIG. 2, the programmable counter 42 is reloaded on each cycle via multiplexer 60 from first data bank register 62 or second data bank register 64. The contents of data bank register 62 are suitably determined by the operator of the oscilloscope, and in a particular embodiment were provided via processor 66 and by way of bus 68. Processor 66 also operates the general oscilloscope circuitry indicated at 74.

The number for entry into data bank register 62 must be such that counting by counter 42 down to terminal count (for instance zero) will take longer than the sweep time plus minimum holdoff period. The count entered by the operator into data bank register 62 may be determined in part by multiplying the signal frequency by the number of countable events per cycle in the input signal to be displayed. The result can be given in events per second. The number of events entered into counter 42 must then be large enough to cause the countdown period to exceed the sweep time plus minimum holdoff. The sweep time plus minimum holdoff is multiplied by the events-per-unit-time number.

A second number is entered into data bank register 64 by the operator, and will typically be one more or one less (the second number events should be large enough to cause the countdown period to exceed sweep time plus minimum holdoff period) than the number entered into data bank register 62. Multiplexer 60 is controlled by edge detector 70, but normally supplies the number in data bank register 62 to the programmable counter 42, and the latter is reloaded each time the counter reaches the terminal count. However, should the operator provide a "bump" signal on lead 72 via bus 68, a data input is provided to flip-flop 80. The next minimum holdoff pulse 32 clocks flip-flop 80 to provide a high input. AND gate 84 which also receives a high input from flip-flop 82. The AND gate output remains high for only one sweep cycle, since on the next cycle, flip-flop 82 would be clocked and the AND gate 84 output would go low. Multiplexer 60 will switch, causing the contents of register 64 to be loaded into counter 42 after the counter reaches its terminal count (TC in FIG. 3), and the counter will then count to the new value before again producing the TC output on lead 44. This new counting period will last for only one sweep cycle of oscilloscope operation, and the counter 42 will thereafter be again loaded from register 62, and will be locked on the new triggering event. The operator can sequentially step through each event until the one of interest becomes the triggering event and is properly displayed.

A detector 86 is suitably provided to give the operator a visual indication or the like when the holdoff count he has selected properly exceeds the minimum holdoff value.

Although counter 42 desirably counts triggering events, a periodic clock signal may alternatively be counted to provide the variable delay.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim

1. A holdoff apparatus for an oscilloscope, comprising:
   means for receiving sweep triggering events related to an input signal to be displayed by said oscilloscope,
   triggering means responsive to one of said sweep triggering events for controlling a sweep in timed relation to a triggering event after conclusion of a holdoff period,
   counting means for counting triggering events and normally concluding the holdoff period of said oscilloscope in response to a predetermined number of triggering events, and
   means for selectively changing said predetermined number counted by said counting means for altering a holdoff period and thereby changing the triggering event to which said triggering means is responsive.

2. A holdoff apparatus according to claim 1 further including minimum holdoff means providing an alternative holdoff signal to said oscilloscope for a minimum predetermined time following each each sweep.

3. A holdoff apparatus according to claim 1 wherein said counting means is programmable and including first register means for receiving said predetermined count, second register means for receiving an altered predetermined count, and multiplexer means for programming said counter from said second register means for a given sweep period under operator selection followed by reprogramming said counter from said first register means.

* * * * *